United States Patent

Ota et al.

[11] Patent Number: 5,942,369
[45] Date of Patent: Aug. 24, 1999

[54] POSITIVE PHOTORESIST COMPOSITION

[75] Inventors: Toshiyuki Ota; Kimiyasu Sano; Masaru Ohta; Hozumi Sato, all of Tsukuba, Japan

[73] Assignee: JSR Corporation, Tokyo, Japan

[21] Appl. No.: 09/013,908

[22] Filed: Jan. 27, 1998

[30] Foreign Application Priority Data

Jan. 27, 1997 [JP] Japan ................... 9-027211

[51] Int. Cl.$^6$ ................ G03F 7/023; G03F 7/30
[52] U.S. Cl. .............. 430/192; 430/165; 430/193; 430/320; 430/324; 430/329
[58] Field of Search ................ 430/165, 192, 430/193, 320, 324, 329

[56] References Cited

U.S. PATENT DOCUMENTS

| 5,134,054 | 7/1992 | Iwasawa et al. | 430/192 |
|---|---|---|---|
| 5,401,604 | 3/1995 | Otsuka et al. | 430/190 |
| 5,413,896 | 5/1995 | Kajita et al. | 430/192 |
| 5,422,222 | 6/1995 | Akaki et al. | 430/190 |
| 5,439,774 | 8/1995 | Iwasawa et al. | 430/190 |
| 5,494,777 | 2/1996 | Shiraki et al. | 430/270.1 |
| 5,561,194 | 10/1996 | Cornett et al. | 525/143 |
| 5,672,459 | 9/1997 | Inomata et al. | 430/191 |

FOREIGN PATENT DOCUMENTS 0 095 388  11/1983  European Pat. Off. .
0 586 860  3/1994  European Pat. Off. .

OTHER PUBLICATIONS

Patent Abstracts of Japan, vol. 17, No. 461 (P–1598), Aug. 23, 1993, JP 5–107752, Apr. 30, 1993.

Derwent Abstracts, AN 95–220896, JP 7–133449, May 23, 1995.

*Primary Examiner*—John S. Chu
*Attorney, Agent, or Firm*—Oblon, Spivak, McClelland, Maier & Neustadt, P.C.

[57] ABSTRACT

A positive photoresist composition including (A) 100 parts by weight of an alkali-soluble novolak resin, and based thereon; (B) 5 to 50 parts by weight of an alkali-soluble acrylic resin containing, as s, 10 to 80% by weight of a unit of a radical-polymerizable compound having an alcoholic hydroxyl group and 3 to 50% by weight of at least one of a unit of a radical-polymerizable compound having a carboxyl group and a unit of a radical-polymerizable compound having a phenolic hydroxyl group; (C) 5 to 100 parts by weight of a quinonediazide group-containing compound; and (D) a solvent, is provided. This composition has a good adhesion to substrates at the time of development and a good plating solution resistance and moreover can be well wetted with plating solutions, can be well developed with alkali developing solutions and can be well stripped from substrates at the resist unexposed areas, and is suited for the formation of thick films suitable as bump forming materials.

15 Claims, No Drawings

POSITIVE PHOTORESIST COMPOSITION

BACKGROUND OF THE INVENTION

1. Field of the Invention

This invention relates to a photoresist composition. More particularly, this invention relates to an alkali-developable positive photoresist composition suited for photofabrication such as bump formation, wiring, interlayer insulating film formation, circuit protective film formation and processing and manufacture of precision parts, carried out when circuit substrates are manufactured and semiconductors and electronic parts are packaged on the circuit substrates.

2. Description of the Prior Art

The photofabrication is a generic term for techniques in which a photosensitive resin composition is coated on the surfaces of process articles and the coating films formed are patterned by photolithography, followed by chemical etching or electrolytic etching using the patterns as masks, or electroforming chiefly using electroplating, any of which are applied alone or in combination, to fabricate various precision parts. This is prevalent in the current precision fine processing techniques.

In recent years, with the downsizing of electronic equipment, there are a rapid progress toward higher integration of LSIs and toward ASIC (application specific integrated circuits), and a demand for multipin thin-film packaging for mounting LSIs on electronic equipment, where the bare chip packaging carried out by the TAB system or flip-chip system has attracted notice. In such multipin packaging, protruded electrodes of 20 μm or more in height, called bumps serving as connecting terminals, must be arranged on the substrate in a high precision, and it has become more required to make the bumps higher in precision so as to be adaptable to any further miniaturization of LSIs in future.

As materials for bump formation used when such bumps are formed, thick-film resists are used. The thick-film resists are meant by resists that can form films of at least about 20 μm thick on substrates. As requirements for such thick-film positive resists, it is needed that they can form films of at least 20 μm thick, have an adhesion to the substrates, have a plating solution resistance and a good wettability to plating solutions when plated to form bumps, and can be readily stripped with stripping solutions.

On the other hand, conventional positive resists for pump formation can not be satisfactory in view of the adhesion to substrates at the time of development in photolithography and also in view of the plating solution resistance. As the patterns for forming bumps are made finer in size, resists having a poor adhesion to substrates at the time of development may more cause a problem that resist patterns come off the substrates at the time of development. Also, resists having a poor plating solution resistance may cause a problem that resist patterns are deformed or cracked when immersed in plating solutions, see "HYOMEN GIJUTU (Surface Techniques) Vol.46, No.9, pp.775–777, 1995".

SUMMARY OF THE INVENTION

An object of the present invention is to solve the problems the prior art has had, to provide a positive photoresist composition that has a good adhesion to substrates at the time of development and a good plating solution resistance and moreover can be well wetted with plating solutions, can be well developed with alkali developing solutions and can be well stripped from substrates at the resist unexposed areas, and is suited for the formation of thick films suitable as bump forming materials.

As a means for solving such problems, the present invention provides a positive photoresist composition comprising;

(A) 100 parts by weight of an alkali-soluble novolak resin, and based thereon;

(B) from 5 to 50 parts by weight of an alkali-soluble acrylic resin containing, as structural units, from 10 to 80% by weight of a unit of a radical-polymerizable compound having an alcoholic hydroxyl group and from 3 to 50% by weight of at least one structural unit selected from the group consisting of a unit of a radical-polymerizable compound having a carboxyl group and a unit of a radical-polymerizable compound having a phenolic hydroxyl group;

(C) from 5 to 100 parts by weight of a quinonediazide group-containing compound; and (D) a solvent.

The positive photoresist composition of the present invention has a good adhesion to substrates at the time of development and a good plating solution resistance and moreover can be well wetted with plating solutions, can be well developed with alkali developing solutions, can be well stripped from substrates at the resist unexposed areas, and exhibits a sufficient resolution when formed in a layer thickness of 20 μm or more. Hence, it is suited for the formation of thick films suitable as bump forming materials.

DESCRIPTION OF THE PREFERRED EMBODIMENTS

The composition of the present invention will be described below in detail. In the following, the terminology "(meth) acrylic acid", "(meth) acrylic", "(meth) acrylate" and the like include "acrylic acid and methacrylic acid", "acrylic and methacrylic", "acrylate and methacrylate" and the like, respectively.

(A) Novolak Resin

The component-(A) novolak resin used in the present invention is obtained by subjecting an aromatic compound having a phenolic hydroxyl group (the compound is hereinafter simply called "phenol compound") and an aldehyde to addition condensation in the presence of a catalyst, the aldehyde being preferably in a proportion of from 0.7 to 1 mol per mol of the phenol compound.

The phenol compound used here may include, e.g., phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 3,6-xylenol, 2,3,5-trimethylphenol, 3,4,5-trimethylphenol, p-phenylphenol, resorcinol, hydroquinone, hydroquinone monomethyl ether, pyrogallol, chloroglucinol, hydroxydiphenyl, bisphenol-A, gallic acid, gallates, α-naphthol and β-naphthol. Of these, o-cresol, m-cresol, p-cresol, 2,3-xylenol, 2,4-xylenol, 2,5-xylenol, 3,4-xylenol, 3,5-xylenol, 2,3,5-trimethylphenol, resorcinol, hydroquinone monomethyl ether and bisphenol-A are preferred, and o-cresol, m-cresol, p-cresol and 3,5-xylenol are more preferred.

The aldehyde may include, e.g., formaldehyde, paraformaldehyde, furfural, benzaldehyde, nitrobenzaldehyde and acetaldehyde. Of these, a preferred aldehyde is formaldehyde.

Both the phenol compound and the aldehyde may be used alone or in combination of two or more. Preferred combination of the phenol compound and the aldehyde includes m-cresol/formaldehyde, m-cresol/p-cresol/formaldehyde, m-cresol/3,5-xylenol/formaldehyde, and m-cresol/p-cresol/ 3,5-xylenol/formaldehyde.

As the catalyst used in the addition condensation reaction, there are no particular limitations on it. For example, as acid catalysts, hydrochloric acid, nitric acid, sulfuric acid, formic acid, oxalic acid and acetic acid may be used.

(B) Acrylic Resin

The alkali-soluble acrylic resin used in the present invention contains a unit of a radical-polymerizable compound having an alcoholic hydroxyl group and at least one structural unit selected from the group consisting of a unit of a radical-polymerizable compound having a carboxyl group and a unit of a radical-polymerizable compound having a phenolic hydroxyl group. In the present invention, "unit" indicates the structural unit formed in said alkali-soluble acrylic resin from the radical-polymerizable compound after the compound having undergone radical polymerization.

Here, the radical-polymerizable compound having an alcoholic hydroxyl group may be exemplified by hydroxyalkyl (meth)acrylates such as 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate and glycerol monomethacrylate, and preferably 2-hydroxyethyl acrylate and 2-hydroxyethyl methacrylate. Any of these compounds may be used alone or in combination of two or more.

The radical-polymerizable compound having a carboxyl group may be exemplified by monocarboxylic acids such as acrylic acid, methacrylic acid and crotonic acid; dicarboxylic acids such as maleic acid, fumaric acid, citroconic acid, mesaconic acid and itaconic acid; and methacrylates having a carboxyl group, such as 2-maleinoyloxyethyl methacrylate, 2-succinoyloxyethyl methacrylate and 2-hexahydrophthaloyloxyethyl methacrylate; and preferably acrylic acid, methacrylic acid and 2-[2-carboxy{hexahydrobenzoyloxy}]ethyl methacrylate. Any of these compounds may be used alone or in combination of two or more.

The radical-polymerizable compound having a phenolic hydroxyl group may be exemplified by vinyl monomers having a phenolic hydroxyl group, such as 3-hydroxystyrene, 4-hydroxystyrene, vinyl 4-hydroxybenzoate, 3-isopropenylphenol and 4-isopropenylphenol. Any of these compounds may be used alone or in combination of two or more. In particular, 4-isopropenylphenol is preferred.

The radical-polymerizable compound having an alcoholic hydroxyl group may preferably be in an amount ranging from 10 to 80% by weight, and more preferably from 20 to 60% by weight, in the alkali-soluble acrylic resin used in the present invention. If it is in an amount more than 80% by weight, the resist tends to have a poor developing performance. If it is in an amount less than 10% by weight, the acrylic resin may have too low a compatibility to novolak resin solution to obtain a uniform resist solution.

The unit(s) of at least one of the radical-polymerizable compound having a carboxyl group and the radical-polymerizable compound having a phenolic hydroxyl group, either used alone or used in combination of two or more, may preferably be in an amount of from 3 to 50% by weight, and more preferably from 5 to 40% by weight, in the alkali-soluble acrylic resin used in the present invention. If it is in an amount less than 3% by weight, the acrylic resin may have a low alkali solubility to cause scums after development, resulting in no sufficient developability. If on the other hand it is in an amount more than 50% by weight, the yield of residual film thickness after development and the plating resistance tends to lower.

For the purpose of appropriately control mechanical properties, the alkali-soluble acrylic resin used in the present invention may also contain a monomer unit derived from a radical-polymerizable compound different from the above radical-polymerizable compound having an alcoholic hydroxyl group, radical-polymerizable compound having a carboxyl group and radical-polymerizable compound having a phenolic hydroxyl group. Such a different radical-polymerizable compound may preferably be exemplified by alkyl (meth)acrylates, aryl (meth)acrylates, dicarboxylates, vinyl group-containing aromatic compounds, conjugated dienes, nitrile group-containing polymerizable compounds, chlorine-containing polymerizable compounds, amide bond-containing polymerizable compounds, and fatty acid vinyl esters. Stated specifically, it may include alkyl (meth) acrylates such as methyl methacrylate, ethyl methacrylate, n-butyl acrylate or methacrylate, sec-butyl acrylate or methacrylate, t-butyl acrylate or methacrylate and isopropyl acrylate or methacrylate; aryl (meth)acrylates such as phenyl acrylate or methacrylate and benzyl acrylate or methacrylate; dicarboxylic diesters such as diethyl maleate, diethyl fumarate and diethyl itaconate; vinyl group-containing aromatic compounds such as styrene, a -methylstyrene, m-methylstyrene, p-methylstyrene and p-methoxystyrene; conjugated dienes such as 1, 3-butadiene, isoprene and 1,4-dimethylbutadiene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and fatty acid vinyl esters such as vinyl acetate. Any of these compounds may be used alone or in combination of two or more. Of these, preferred compounds are styrene and (meth)acrylates, in particular, methyl methacrylate, ethyl methacrylate and n-butyl acrylate. The monomer unit comprised of the different radical-polymerizable compound held in the alkali-soluble acrylic resin used in the present invention may preferably be in an amount less than 60% by weight, and more preferably less than 50% by weight.

As a solvent used when the component- (B) alkali-soluble acrylic resin used in the present invention is synthesized, it may include, e.g., alcohols such as methanol, ethanol, ethylene glycol, diethylene glycol and propylene glycol; cyclic ethers such as tetrahydrofuran and dioxane; polyhydric alcohol alkyl ethers such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether; polyhydric alcohol alkyl ether acetates such as ethylene glycol ethyl ether acetate, diethylene glycol ethyl ether acetate and propylene glycol ethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone and diacetone alcohol; and esters such as ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate and methyl 3-ethoxypropionate. Of these, cyclic ethers, polyhydric alcohol alkyl ethers, polyhydric alcohol alkyl ether acetates, ketones and esters are preferred.

As a polymerization catalyst used when the component-(B) alkali-soluble acrylic resin used in the present invention is synthesized, conventional radical polymerization initiators may be used, which may include, e.g., azo compounds such as 2,2'-azobisbutylonitrile, 2,2'-azobis-(2,4-dimethylvaleronitrile) and 2,2'-azobis -(4-methoxy-2,4-dimethylvaleronitrile); and organic peroxides or hydrogen peroxides such as benzoyl peroxide, lauroyl peroxide, t-butylperoxypivarate and 1,1'-bis-(t-butylperoxy) cyclohexane. When peroxides are used in the radical polymerization initiators, reducing agents may be combined to form redox type initiators.

In the present invention, this component-(B) may preferably be mixed in an amount ranging from 5 to 50 parts by weight, and more preferably from 10 to 40 parts by weight based on 100 parts by weight of the component-(A) novolak resin. If it is mixed in an amount less than 5 parts by weight, the resist may have a low plating solution resistance to cause, e.g., cracks at the time of plating. If it is in an amount more than 50 parts by weight, the resist film formed may have a low homogeneity to tend to cause a deterioration of resolution.

(C) Quinonediazide Group-Containing Compound

The component-(C) quinonediazide group-containing compound constituting the composition of the present invention has, e.g., a structure wherein a hydroxyl group or amino group of the following compounds (I) to (VI) and a carboxyl group of a naphtoquinonediazide group-containing sulfonic acid, such as naphthoquinone-1,2-diazide-5-sulfonic acid, and naphthoquinone-1,2-diazide-4-sulfonic acid have formed an ester linkage or amide linkage, and may include completely esterified products, partially esterified products, amidized products and partially amidized products of the compounds (I) to (VI).

(I) Polyhydroxybenzophenones such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2 ',3,4,4'-pentahydroxybenzophenone, 2,2',3,4,5-pentahydroxybenzophenone, 2,3',4,4',5',6-hexahydroxybenzophenone and 2,3,3',4,4',5'-hexahydroxybenzophenone;

(II) bis[(poly)hydroxyphenyl]alkanes such as bis(2,4-dihydroxyphenyl)methane, bis(2,3,4-trihydroxyphenyl) methane, 2-(4-hydroxyphenyl)-2-(4'-hydroxyphenyl) propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl]ethylidene}bisphenol and 3,3'-dimethyl-{1-[4-[2-(3-methyl-4-hydroxyphenyl)-2-propyl]phenyl]ethylidene}bisphenol;

(III) tris (hydroxyphenyl)methanes and those a hydrogen atom of the benzene ring of which has been substituted with a methyl group (hereinafter "methyl-substituted products"), such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane and bis(4-hydroxy-3,5-dimethylphenyl)-3,4-dihydroxyphenylmethane;

(IV) bis(cyclohexylhydroxyphenyl)(hydroxyphenyl) methanes and methyl-substituted products thereof such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis (3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis (3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane and bis(5-cyclohexyl-2-hydroxy-4-methylphenyl)-4-hydroxyphenylmethane;

(V) aromatic compounds having a phenolic hydroxyl group or amino group, including phenol compounds such as phenol, p-methoxyphenol, dimethylphenol, hydroquinone, naphthol, pyrocatechol, pyrogallol and gallic acid; partially etherified compounds of polyphenol compounds, such as pyrogallol monomethyl ether and pyrogallol-1,3-dimethyl ether; aniline, p-aminodiphenylamine and 4,4'-diaminobenzophenone; and (VI) novolak resins, pyrogallol-acetone resins, p-hydroxystyrene homopolymers, and copolymers of monomers copolymerizable with p-hydroxystyrene.

Preferred quinonediazide group-containing compounds are 2,3,4-trihydroxybenzophenone, 2,3,4,4'-tetrahydroxybenzophenone, 2,2',3,4,4'-pentahydroxybenzophenone, 2-(4-hydroxyphenyl)-2-(4'-hydroxyphenyl)propane, 2-(2,3,4-trihydroxyphenyl)-2-(2', 3',4'-trihydroxyphenyl)propane, 4,4'-{1-[4-[2-(4-hydroxyphenyl)-2-propyl]phenyl]ethylidene}bisphenol, tris (4-hydroxyphenyl)methane, bis(4-hydroxy-2,5-dimethylphenyl)-4-hydroxyphenylmethane and bis(4-hydroxy-2,5-dimethylphenyl)-2-hydroxyphenylmethane.

In the composition of the present invention, as the component (C), any of the above quinonediazide group-containing compounds may be used alone or in combination of two or more.

This component (C) may preferably be mixed in an amount ranging from 5 to 100 parts by weight, and more preferably from 10 to 50 parts by weight, based on 100 parts by weight of the component-(A) novolak resin. If it is mixed in an amount less than 5 parts by weight, no images faithful to patterns can be obtained, resulting in a low transfer performance. If on the other hand it is in amount more than 100 parts by weight, the resist may have a very low sensitivity, undesirably.

(D) Solvent

The positive photoresist composition of the present invention may preferably be used in the form of a solution, prepared by dissolving the component-(A) novolak resin, the component-(B) acrylic resin and the component-(C) quinonediazide group-containing compound serving as a sensitizer in a suitable solvent, component (D).

As examples of such a component-(D) solvent, it may include ethylene glycol alkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol alkyl ether acetates such as propylene glycol monomethyl ether acetate, propylene glycol monoethyl ether acetate and propylene glycol monopropyl ether acetate; ketones such as acetone, methyl ethyl ketone, cyclohexanone and methyl amyl ketone; aromatic hydrocarbons such as toluene and xylene; cyclic ethers such as dioxane; and esters such as methyl 2-hydroxypropionate, ethyl 2-hydroxypropionate, ethyl 2-hydroxy-2-methylpropionate, ethyl ethoxyacetate, ethyl hydroxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate and ethyl acetoacetate. Any of these may be used alone or in combination of two or more. In order to form films of at least 20 μm thick by spin-coating the resultant positive photoresist composition, the solvent may preferably be used in an amount that provides a solid matter concentration ranging from 30% by weight to 65% by weight. If the solid matter concentration is too low, it is difficult to form the films of at least 20 μm thick that are suitable as bump forming materials. If it is too high, the composition may have so extremely poor a fluidity that it can be handled with difficulty and moreover makes it difficult to obtain uniform resist films by spin coating.

Other Components

In the composition of the present invention, various additives may be mixed so long as the object and effect of the present invention are not damaged.

A surface-active agent may be optionally added in order to improve coating properties, anti-foaming properties and leveling properties. As the surface-active agent, fluorine type surface-active agents may be used which are commercially available by the trade names of BM-1000, BM-1100 (produced by BM Chemy Co.); MEGAFAC F142, F172, F173, F183 (produced by Dainippon Ink & Chemicals, Incorporated); FLORARD FC-135, FC-170, FC-430, FC-431 (produced by Sumitomo 3M Limited); SURFCON S-112, S-113, S-131, S-141, S-145 (produced by Asahi Glass Co., Ltd.); and SH-28PA, SH-190, SH-193, S2-6032, SF-8428 (Toray Silicone Co., Ltd.). Any of these surface-active agent may be used in an amount not more than 5 parts by weight, and more respectively from 0.05 to 5 parts by weight, based on 100 parts by weight of the component-(A) novolak resin.

In the composition of the present invention, an adhesive auxiliary may be used in order to improve its adhesion to the substrate. As the adhesive auxiliary used, a functional silane coupling agent is effective. Here, the functional silane coupling agent is meant by a silane coupling agent having a reactive substituent such as a carboxyl group, a methacryloyl group, an isocyanate group or an epoxy group. As specific examples, it may include trimethoxysilylbenzoic acid, γ-methacryloxypropyltrimethoxysilane, vinyltriacetoxysilane, vinyltrimethoxysilane, γ-glycidoxypropyltrimethoxysilane and β-(3,4-epoxycyclohexyl)ethyltrimethoxysilane. It may be mixed in an amount not more than 20 parts by weight, and more respectively from 0.05 to 5 parts by weight, based on 100 parts by weight of the component-(A) novolak resin.

In the composition of the present invention, in order to micro-adjust its solubility in the alkali developing solution, it is possible to add a monocarboxylic acid such as acetic acid, propionic acid, n-butyric acid, iso-butyric acid, n-valeric acid, iso-valeric acid, benzoic acid or cinnamic acid; a hydroxymonocarboxylic acid such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid or syringic acid; a polyhydric carboxylic acid such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentatetracarboxylic acid, butanetetracarboxylic acid or 1,2,5,8-napthalenetetracarboxylic acid; or an acid anhydride such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol anhydrotrimellitate or glycerol trisanhydrotrimellitate.

For the purpose of adjusting uniformity of coating films, it is also possible to add a high-boiling solvent such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic, 1-octanol, 1-nonanol, benzylalcohol, benzylacetate, ethyl benzoate, diethyl oxalate, diethyl maleate, γ-butylolactone, ethylene carbonate, propylene carbonate or phenyl cellosolve acetate. Such a solvent may be used in an amount adjusted in accordance with purposes and coating processes, and there are no particular limitations on it so long as the composition can be uniformly mixed. It may be used in an amount not more than 60% by weight, and preferably not more than 40% by weight, based on the weight of the composition obtained.

In the composition of the present invention, a filler, a colorant, a viscosity modifier and so forth may be optionally further added. The filler may include silica, alumina, talc, bentonite, zirconium silicate and powdered glass. The colorant may include extender pigments such as alumina white, clay, barium carbonate and barium sulfate; inorganic pigments such as zinc white, white lead, chrome yellow, red lead, ultramarine blue, titanium oxide, zinc chromate, red iron oxide and carbon black; organic pigments such as Brilliant Carmine 6B, Permanent Red 6B, Permanent Red R, Benzidine Yellow, Phthalocyanine Blue and Phthalocyanine Green; basic dyes such as magenta and Rhodamine; direct dyes such as Direct Scarlet and Direct Orange; and acid dyes such as Rhocerin and Metanil Yellow. The viscosity modifier may include bentonite, silica gel and aluminum powder. These additives may be used in such an amount that they do not damage the essential properties of the composition, and preferably not more than 50% by weight based on the weight of the composition obtained.

The above various optional additives may each be used alone or in combination of two or more.

The composition of the present invention may be prepared by only mixing and stirring the materials by conventional methods when the filler and the pigment are not used. When the filler and the pigment are used, the materials may be dispersed and mixed by means of a dispersion machine such as a dissolver, a homogenizer or a three-roll mill, further optionally followed by filtration using a mesh filter or a membrane filter.

Uses

The composition of the present invention is suitable for thick-film formation and, without limitation to such a field, can be used in, e.g., protective films formed when various substrates such as copper, chromium, iron and glass substrates are etched, and resists for semiconductor fabrication.

The bumps formed by preparing a resist film of at least 20 μm thick using the composition of the present invention are formed by the following process. That is, a process for forming bumps according to the present invention comprises the steps of;

coating the above composition of the present invention on a substrate having a given wiring pattern to form a coating;

prebaking the coating to form a resist film;

selectively exposing the resist film to radiations at its wiring pattern areas on which bumps are to be formed;

developing the exposed resist film;

plating the areas from which the resist film has been removed; and stripping the resist film.

(1) Formation of Coating/Resist Film

A solution of the composition prepared as described above is coated on a substrate having a given wiring pattern to form a coating, and the coating formed is heated (prebaked) to remove the solvent to form the desired resist film.

To coat the composition on the substrate, a process such as spin coating, roll coating, screen printing or applicator coating may be employed.

Prebaking conditions may differ depending on the types of the respective components in the composition, their mixing proportion and the coating layer thickness. Usually the prebaking may be carried out at 70 to 130° C., and preferably 80 to 120° C., for 2 to 60 minutes.

(2) Exposure to Radiations

The resist film thus formed is exposed to ultraviolet radiations or visible light radiations of 300 to 500 nm in wavelength through a mask with a given pattern, to expose the resist film only at its wiring pattern areas on which bumps are to be formed. As radiation sources of these, low-pressure mercury lamps, high-pressure mercury lamps, ultrahigh-pressure mercury lamps, metal halide lamps, argon gas lasers or the like may be used. The radiations to which the resist film is exposed are ultraviolet rays, visible light rays, far ultraviolet rays, X-rays, electron rays or the like.

Radiation dose may differ depending on the types of the respective components in the composition, their mixing proportion and the coating film layer thickness. For example, in the case when the ultrahigh-pressure mercury lamps are used, the radiation dose is 100 to 2,000 mJ/cm$^2$.

(3) Development

After the exposure to radiations, the unexposed pattern is developed by dissolving and removing the exposed unnecessary areas, using an alkaline solution as a developing solution, to make only the radiation-unexposed areas remain. As the developing solution, an aqueous solution of a basic compound may be used; the basic compound including, e.g., sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene and 1,5-diazabicyclo[4.3.0]-5-nonane. An aqueous solution prepared by adding to the aqueous solution of any of these basic compounds a water-soluble organic solvent or a surface-active agent may also be used as the developing solution.

Development time may differ depending on the types of the respective components in the composition, their mixing proportion and the dried coating thickness of the composition. Usually the development may be carried out for 1 to 30 minutes, and may be carried out by any of dip development, paddle development and spray development. After the development, rinsing with running water is carried out for 30 to 90 seconds, followed by air drying by means of an air gun or drying in an oven.

EXAMPLES

The present invention will be described below in greater detail by giving Examples. The present invention is by no means limited to these Examples. In the following, "part(s)" refers to "part(s) by weight", and "%", "% by weight", unless particularly noted. Weight average molecular weight is meant by weight average molecular weight in terms of polystyrene as measured by gel permeation chromatography.

Synthesis of Component-(A) Novolak Resin

SYNTHESIS EXAMPLE 1

80 g of m-cresol, 120 g of p-cresol, 120 g of 37% formalin and 2.8 g of oxalic acid dihydrate were allowed to react at 90° C. for 3 hours. Thereafter, the inside of the reaction system was gradually evacuated to 30 mmHg, and the reaction temperature was gradually raised by heating until it finally reached 180° C. to remove water content and residual monomers. After the reaction, the resin remaining was poured into a vat, followed by cooling and pulverization to obtain flaky resin. In order to subject this resin to fractionation, 20 g of the resin was subsequently dissolved in 80 g of ethyl acetate, and 50 g of hexane was added thereto. The phase-separated low-molecular weight region was cut away to obtain a novolak resin with a weight average molecular weight of 15,000. This resin is designated as novolak resin A1.

SYNTHESIS EXAMPLE 2

The same procedure of Synthesis Example 1 was repeated except that 120 g of m-cresol, 90 g of 3,5-xylenol, 120 g of 37% formalin and 2.8 g of oxalic acid dihydrate were used. Thus, a novolak resin with a weight average molecular weight of 8,000 was obtained. In the present Example, the fractionation carried out in Example 1 was not carried out and the product was used to prepare a resist. This resin is designated as novolak resin A2.

SYNTHESIS EXAMPLE 3

The same procedure of Synthesis Example 1 was repeated except that 100 g of m-cresol, 60 g of p-cresol, 40 g of 3,5-xylenol, 120 g of 37% formalin and 2.8 g of oxalic acid dehydrate were used. Thus, a novolak resin with a weight average molecular weight of 9,500 was obtained. In the present Example, the fractionation carried out in Example 1 was not carried out and the product was used to prepare a resist. This resin is designated as novolak resin A3.

SYNTHESIS EXAMPLE 4

The inside of a flask provided with a dry ice/methanol reflux condenser and a thermometer was replaced by nitrogen, and thereafter 3.0 g of 2,2'-azobisbutyronitrile as a polymerization initiator and 225 g of ethyl 2-hydroxypropionate were charged into it, followed by stirring until the polymerization initiator dissolved. Subsequently, 75.0 g of 2-hydroxyethyl methacrylate, 60.0 g of n-butyl acrylate and 15.0 g of 2-[2-carboxy{hexahydrobenzoyloxy}]ethyl methacrylate were charged, followed by gentle stirring. Thereafter, the temperature of the solution was raised to 80° C., and polymerization was carried out at this temperature for 4 hours. Thereafter, the reaction mixture was cooled to room temperature, and the inside of the flask was replaced by the air, followed by addition of 150 mg of p-methoxyphenol as a stabilizing agent. The reaction product was dropwise added in a large quantity of methanol to settle acrylic resin. The sediment thus obtained was washed with water, and thereafter dissolved in tetrahydrofuran with the same weight, followed by sedimentation was again carried out in a large quantity of methanol. This procedure of re-dissolution and sedimentation was carried out three times in total, and thereafter the sediment obtained was vacuum-dried at 40° C. for 48 hours to obtain acrylic resin B1.

SYNTHESIS EXAMPLE 5

The same procedure of Synthesis Example 4 was repeated except that the starting material monomers were replaced with 75.0 g of 2-hydroxyethyl methacrylate, 60.0 g of n-butyl acrylate and 15.0 g of 4-isopropenylphenol. Thus, acrylic resin B2 was obtained.

SYNTHESIS EXAMPLE 6

The same procedure of Synthesis Example 4 was repeated except that the starting material monomers were replaced with 40.0 g of 2-hydroxyethyl acrylate, 80.0 g of methyl methacrylate and 30.0 g of methacrylic acid. Thus, acrylic resin B3 was obtained.

SYNTHESIS EXAMPLE 7

The same procedure of Synthesis Example 4 was repeated except that the starting material monomers were replaced with 30.0 g of 2-hydroxyethyl acrylate, 90.0 g of styrene and 30.0 g of methacrylic acid. Thus, acrylic resin B4 was obtained.

SYNTHESIS EXAMPLE 8

The same procedure of Synthesis Example 4 was repeated except that the starting material monomers were replaced with 75.0 g of 2-hydroxyethyl acrylate and 75.0 g of n-butyl acrylate. Thus, acrylic resin b1 was obtained.

SYNTHESIS EXAMPLE 9

The same procedure of Synthesis Example 4 was repeated except that the starting material monomers were replaced with 150.0 g of 2-hydroxyethyl acrylate. Thus, acrylic resin b2 was obtained.

SYNTHESIS EXAMPLE 10

The same procedure of Synthesis Example 4 was repeated except that the starting material monomers were replaced with 45.0 g of dicyclopentanyl methacrylate, 90.0 g of n-butyl acrylate and 15.0 g of methacrylic acid. Thus, acrylic resin b3 was obtained.

SYNTHESIS EXAMPLE 11

The same procedure of Synthesis Example 4 was repeated except that the starting material monomers were replaced with 75.0 g of 2-hydroxyethyl acrylate, 15.0 g of methacrylic acid, 50.0 g of n-butyl acrylate and 10.0 g of 4-isopropenylphenol. Thus, acrylic resin B5 was obtained.

SYNTHESIS EXAMPLE 12

The same procedure of Synthesis Example 4 was repeated except that the starting material monomers were replaced with 110.0 g of 2-hydroxyethyl acrylate, 15.0 g of n-butyl methacrylate and 25.0 g of methacrylic acid. Thus, acrylic resin B6 was obtained.

SYNTHESIS EXAMPLE 13

The same procedure of Synthesis Example 4 was repeated except that the starting material monomers were replaced with 30.0 g of 2-hydroxyethyl acrylate, 30.0 g of n-methyl methacrylate and 90.0 g of methacrylic acid. Thus, acrylic resin b4 was obtained.

Example 1

(1) Preparation of Composition 100 parts of the novolak resin A1, 20 parts of a reaction product obtained by esterifying 1 mol of 4,4'-{1-[4-[2-(4-hydroxyphenyl)-2-propyl]phenyl]ethylidene}bisphenol with 1.5 mols of naphthoquinone-1,2-diazido-5-sulfonyl chloride as the component-(C) sensitizer, 0.05 part of SF-8428 (available from Toray Silicone Co., Ltd.) as a surface-active agent and 20 parts of the acrylic resin B1 were dissolved in a mixed solvent of 75 parts of ethyl 2-hydroxypropionate and 75 parts of ethyl ethoxypropionate, and thereafter the resultant solution was filtered using a membrane filter of 40 μm in pore size. Thus, a positive photoresist composition with a solid content of 48% by weight was prepared. Its make-up is summarized in Table 1.

Using this composition, its properties shown below were evaluated. Results obtained are shown in Table 2.

(2) Evaluation of Properties (i) Compatibility

The above positive photoresist composition was stirred at room temperature for 24 hours to carry out mixing, and its state immediately after stirring and upon leaving for 30 days after completion of the stirring was visually observed. How it stood was evaluated according to the following criteria:

○: The composition was seen to have been uniformly dissolved immediately after stirring, and also seen to be in the uniformly dissolved state even after 30 days.

Δ: The composition was seen to have been uniformly dissolved immediately after stirring, but seen to have caused phase separation after 30 days.

X: The composition was not in the uniformly dissolved state on 24 hours after stirring.

(ii) Coating Properties

The above positive photoresist composition was coated on a 4 inch silicon wafer by means of a spin coater at 1,200 rpm for 10 seconds, and the coating formed was heated at 100° C. for 5 minutes on a hot plate. The surface of the dry film formed was visually observed to evaluate coating properties according to the following criteria.

○: The film formed is free of unevenness and is uniform.

X: The film formed has unevenness such as pinholes and cissing.

(iii) Resolution

The above positive photoresist composition was coated on a 4 inch silicon wafer by means of a spinner at 1,200 rpm for 10 seconds, and the coating formed was heated at 100° C. for 5 minutes on a hot plate and subsequently prebaked at 100° C. for 30 minutes using a hot-air circulation type dryer to form a coating film of about 50 μm thick. Next, through a pattern mask for measuring resolution, the coating film, which was formed on one sheet of coated substrate dividedly in three regions, was exposed to ultraviolet rays using ultrahigh mercury lamps (USH-250D, manufactured by Ushio) at doses of 500 mJ/cm$^2$, 750 mJ/cm$^2$ and 1,000 mJ/cm$^2$, respectively. The substrate was then subjected to development using a 2.38% aqueous tetramethylammonium hydroxide solution. Thereafter, the film thus processed was rinsed with running water, followed by nitrogen blowing to obtain a patternwise cured product. This was observed on an optical microscope to evaluate as "○" an instance where an off-pattern (a female pattern) of 50 μm cubes (i.e., 50 μm thick areas) has been resolved at any of the above exposure doses, and as "X" an instance where it has been not.

(iv) Plating Solution Resistance

The substrate having the patternwise cured product formed in the above (iii) evaluation test was made into test materials. The test materials were immersed in the following two kinds of plating solutions for a prescribed time, and then rinsed with running water to obtain processed test materials. Electrolytic copper sulfate plating solution (A) and copper pyrophosphate plating solution (B). as shown below were used as the plating solutions. The processed test materials were observed on an optical microscope and a scanning electron microscope to examine how the patternwise cured product stood, to evaluate its plating solution resistance according to the following criteria. Results obtained are shown in Table 2.

○: Any particular changes in state are seen in the patternwise cured product.

X: Cracks or deformation occur in the patternwise cured product.

Specification of the Electrolytic Copper Sulfate Plating Solution (A) and Test Conditions Sulfuric acid: 200 g/litter
Copper sulfate pentahydrate: 70 g/litter
Hydrochloric acid (12N): 50 mg/litter
Water: in a quantity providing 1 liter on the whole
pH: 1 or below
Immersion temperature: 40° C.
Immersion time: 60 minutes Specification of the Copper Pyrophosphate Plating Solution (B) and Test Conditions Copper pyrophosphate trihydrate: 90 g/litter
Potassium pyrophosphate: 375 g/litter
Ammonia (specific gravity: 0.9) 3 ml/litter
Water: in a quantity providing 1 liter on the whole
pH: 8.6
Immersion temperature: 50° C.
Immersion time: 50 minutes The pH was adjusted by adding tripolyphosphoric acid.

(v) Strippability

The substrate having the patternwise cured product formed in the above (iii) was used as a test material, and was immersed in a stripping solution (a dimethyl sulfoxide solution of 0.5 wt. % tetramethylammonium hydroxide; water content: 1.5 wt. %) with stirring at room temperature, and thereafter washed with running water to strip the patternwise cured product. The surface of the test material was visually observed or observed on an optical microscope to make evaluation according to the following criteria. Results obtained are shown in Table 2.

○: No residues of the patternwise cured product are seen.
X: Residues of the patternwise cured product are seen.

Examples 2 to 12 and Comparative Examples 1 to 6

Resist compositions were prepared in the same manner as in Example 1 except that in each example one or both of the novolak resin A1 and acrylic resin B1 was replaced with at least one of the novolak resin and acrylic resin shown in Table 1. Subsequently the properties of each composition were evaluated in the same manner as in Example 1. Results obtained are shown in Table 2.

Example 13

A positive photoresist composition was prepared in the same manner as in Example 1 except that the ethyl 2-hydroxypropionate and ethyl ethoxypropionate used as solvents were used in amounts of 210 parts and 210 parts, respectively. The composition was coated on a 4 inch silicon wafer by means of a spin coater at 1,200 rpm for 10 seconds, and thereafter the coating formed was heated at 100° C. for 5 minutes on a hot plate and subsequently prebaked at 100° C. for 30 minutes using a hot-air circulation type dryer. As a result, a coating film of about 8 μm thick was formed, and the layer thickness of at least 20 μm suited for the bump formation was not achievable.

TABLE 1

|  |  | Novolak resin (A) | Acrylic resin (B) | Solid matter concentration (wt. %) |
| --- | --- | --- | --- | --- |
| Example: | 1 | A1 100 parts | B1 20 parts | 48 |
|  | 2 | A2 100 parts | B2 30 parts | 50 |
|  | 3 | A3 100 parts | B3 20 parts | 48 |
|  | 4 | A1 100 parts | B4 30 parts | 50 |
|  | 5 | A2 100 parts | B1 30 parts | 50 |
|  | 6 | A2 100 parts | B3 40 parts | 52 |
|  | 7 | A2 100 parts | B3 30 parts | 50 |
|  | 8 | A3 100 parts | B4 20 parts | 48 |
|  | 9 | A3 100 parts | B4 10 parts | 46 |
|  | 10 | A3 100 parts | B1 40 parts | 52 |
|  | 11 | A2 100 parts | B5 30 parts | 50 |
|  | 12 | A2 100 parts | B6 30 parts | 50 |
| Comparative Example: | 1 | A1 100 parts | none | 44 |
|  | 2 | A2 100 parts | b1 30 parts | 50 |
|  | 3 | A2 100 parts | b2 30 parts | 50 |
|  | 4 | A3 100 parts | b3 30 parts | 50 |
|  | 5 | A1 100 parts | b1 30 parts | 50 |
|  | 6 | A1 100 parts | b4 30 parts | 50 |

TABLE 2

|  |  | Compatibility | Coating properties | Resolution | Plating solution resistance Plating solutions (A)/(B) | Strippability |
| --- | --- | --- | --- | --- | --- | --- |
| Example: | 1 | ○ | ○ | ○ | ○/○ | ○ |
|  | 2 | ○ | ○ | ○ | ○/○ | ○ |
|  | 3 | ○ | ○ | ○ | ○/○ | ○ |
|  | 4 | ○ | ○ | ○ | ○/○ | ○ |
|  | 5 | ○ | ○ | ○ | ○/○ | ○ |
|  | 6 | ○ | ○ | ○ | ○/○ | ○ |
|  | 7 | ○ | ○ | ○ | ○/○ | ○ |
|  | 8 | ○ | ○ | ○ | ○/○ | ○ |

TABLE 2-continued

|  |  | Compatibility | Coating properties | Resolution | Plating solution resistance Plating solutions (A)/(B) | Strippability |
|---|---|---|---|---|---|---|
|  | 9 | o | o | o | o/o | o |
|  | 10 | o | o | o | o/o | o |
|  | 11 | o | o | o | o/o | o |
|  | 12 | o | o | o | o/o | o |
| Comparative Example: | 1 | o | o | o | x/x | o |
|  | 2 | Δ | x | x | o/x | o |
|  | 3 | o | o | x | x/x | x |
|  | 4 | x | x | — | — | — |
|  | 5 | Δ | x | x | o/x | o |
|  | 6 | Δ | x | x* | — | — |

Remarks:
*Pattern seriously swelled and peeled.

What is claimed is:

1. A positive photoresist composition comprising;
   (A) 100 parts by weight of an alkali-soluble novolak resin, and based thereon;
   (B) from 5 to 50 parts by weight of an alkali-soluble acrylic resin containing from 10 to 80% by weight of a unit of a radical-polymerizable compound having an alcoholic hydroxyl group and from 3 to 50% by weight of a structural unit selected from the group consisting of a unit of a radical-polymerizable compound having a carboxyl group and a unit of a radical-polymerizable compound having a phenolic hydroxyl group;
   (C) from 5 to 100 parts by weight of a quinonediazide group-containing compound; and
   (D) a solvent.

2. The composition of claim 1, wherein the component-(A) novolak resin is obtained by addition condensation of a phenol compound selected from the group consisting of o-cresol, m-cresol, p-cresol, 2,3-xylenol, 2,4-xylenol, 2,5-xylenol, 3,4-xylenol, 3,5-xylenol, 2,3,5-trimethylphenol, resorcinol, hydroquinone monomethyl ether and bisphenol-A with an aldehyde compound formaldehyde.

3. The composition of claim 1, wherein the component-(A) novolak resin is obtained by addition condensation of a phenol compound with an aldehyde compound; the latter being in a proportion of from 0.7 mol to 1 mol per mol of the former.

4. The composition of claim 1, wherein the radical-polymerizable compound having an alcoholic hydroxyl group in the component-(B) acrylic resin is a hydroxyalkyl (meth)acrylate.

5. The composition of claim 4, wherein said hydroxyalkyl (meth)acrylate is a compound selected from the group consisting of 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate and glycerol monomethacrylate.

6. The composition of claim 5, wherein said hydroxyalkyl acrylate or methacrylate is 2-hydroxyethyl acrylate, 2-hydroxyethyl methacrylate or a combination of these.

7. The composition of claim 1, wherein the radical-polymerizable compound having a carboxyl group in the component-(B) acrylic resin is a compound selected from the group consisting of a monocarboxylic acid, a dicarboxylic acid and a methacrylate having a carboxyl group.

8. The composition of claim 7, wherein said radical-polymerizable compound having a carboxyl group is a compound selected from the group consisting of acrylic acid, methacrylic acid and 2-hexahydrophthaloyloxyethyl methacrylate.

9. The composition of claim 1, wherein said radical-polymerizable compound having a phenolic hydroxyl group is a vinyl compound having a phenolic hydroxyl group.

10. The composition of claim 9, wherein said vinyl compound is a compound selected from the group consisting of 3-hydroxystyrene, 4-hydroxystyrene, vinyl 4-hydroxybenzoate, 3-isopropenylphenol and 4-isopropenylphenol.

11. The composition of claim 1, wherein the component-(B) acrylic resin contains the radical-polymerizable compound having an alcoholic hydroxyl group, in an amount of from 20 to 60% by weight, and the structural unit selected from the group consisting of a unit of a radical-polymerizable compound having a carboxyl group and a unit of a radical-polymerizable compound having a phenolic hydroxyl group, in an amount of from 5 to 40% by weight.

12. The composition of claim 1, wherein the component-(C) quinonediazide group-containing compound is a quinonediazidosulfonic acid ester or quinonediazidosulfonic acid amide of a compound selected from the group consisting of a polyhydroxybenzophenone, a bis [(poly)hydroxyphenyl] alkane, a tris(hydroxyphenyl)methane and a methyl-substituted product thereof, a bis(cyclohexylhydroxyphenyl) (hydroxyphenyl)methane and a methyl-substituted product thereof, an aromatic compound having a phenolic hydroxyl group or amino group, a novolak resin, a pyrogallol-acetone resin, a p-hydroxystyrene homopolymer, and a copolymer of monomers copolymerizable with p-hydroxystyrene.

13. The composition of claim 1, wherein the component-(D) solvent is an ethylene glycol alkyl ether, a diethylene glycol dialkyl ether, an ethylene glycol alkyl ether acetate, a propylene glycol alkyl ether acetate, a ketone, an aromatic hydrocarbon, a cyclic ether, an ester, or a mixed solvent of two or more of of these.

14. The composition of claim 1, wherein the component (B) is present in an amount of from 5 parts by weight to 50 parts by weight based on 100 parts by weight of the component (A), the component (C) is present in an amount of from 5 parts by weight to 100 parts by weight based on 100 parts by weight of the component (A), and the component (D) is present in a solid matter concentration of from 30% by weight to 65% by weight.

15. A process for forming bumps, comprising the steps of;
   coating the composition according to claim 1 on a substrate having a given wiring pattern to form a coating;
   prebaking the coating to form a resist film;
   selectively exposing the resist film to radiations at its wiring pattern areas on which bumps are to be formed;
   developing the exposed resist film;
   plating the areas from which the resist film has been removed; and
   stripping the resist film.

* * * * *